(12) United States Patent
Haldar et al.

(10) Patent No.: US 8,943,937 B2
(45) Date of Patent: Feb. 3, 2015

(54) POWER TOOL WITH CIRCUIT FOR SENSING CONTACT BETWEEN AN IMPLEMENT AND AN OBJECT

(71) Applicants: Robert Bosch Tool Corporation, Broadview, IL (US); Robert Bosch GmbH, Stuttgart (DE)

(72) Inventors: Arindam Haldar, Bangalore (IN); Bharadwaja Maharshi Ramaswamy, Bangalore (IN); Niranjan Sathyanarayanarao Krishnarao, Bangalore (IN)

(73) Assignee: Robert Bosch GmbH, Stuttgart (DE)

( * ) Notice: Subject to any disclaimer, the term of this patent is extended or adjusted under 35 U.S.C. 154(b) by 105 days.

(21) Appl. No.: 13/827,471

(22) Filed: Mar. 14, 2013

(65) Prior Publication Data

US 2014/0090530 A1    Apr. 3, 2014

(30) Foreign Application Priority Data

Sep. 28, 2012  (IN) .......................... 4066/CHE/2012

(51) Int. Cl.
| | | |
|---|---|---|
| B23Q 11/06 | (2006.01) | |
| F16P 3/00 | (2006.01) | |
| B23D 59/00 | (2006.01) | |
| G01R 19/00 | (2006.01) | |
| G01R 19/25 | (2006.01) | |
| B23Q 11/00 | (2006.01) | |
| B23Q 17/24 | (2006.01) | |

(52) U.S. Cl.
CPC ................ *F16P 3/00* (2013.01); *B23D 59/001* (2013.01); *G01R 19/0038* (2013.01); *G01R 19/2506* (2013.01); *B23Q 11/0082* (2013.01); *B23Q 17/2438* (2013.01)
USPC ........................................... 83/58; 192/129 A

(58) Field of Classification Search
None
See application file for complete search history.

(56) References Cited

U.S. PATENT DOCUMENTS

| | | | |
|---|---|---|---|
| 3,656,065 | A | 4/1972 | Reinhard et al. |
| 5,019,771 | A | 5/1991 | Yang et al. |
| 7,171,879 | B2 * | 2/2007 | Gass et al. ......................... 83/58 |
| 7,373,863 | B2 | 5/2008 | O'Banion et al. |
| 7,827,889 | B2 | 11/2010 | Carrier |
| 8,186,256 | B2 | 5/2012 | Carrier |
| 2010/0206145 | A1 | 8/2010 | Tetelbaum et al. |
| 2010/0301215 | A1 | 12/2010 | Gonopolskiy et al. |

OTHER PUBLICATIONS

International Search Report and Written Opinion corresponding to PCT Application No. PCT/IN2013/000590, mailed Mar. 6, 2014 (9 pages).

* cited by examiner

*Primary Examiner* — Rodney H Bonck
(74) *Attorney, Agent, or Firm* — Maginot Moore & Beck LLP

(57) ABSTRACT

A power tool includes a sensing circuit mounted on a printed circuit card is electrically connected to a switching power supply that supplies electrical power to the sensing circuit. The sensing circuit is not connected to earth ground to enable detection of an operator approaching a moving implement without the operator necessarily being electrically connected to earth ground.

5 Claims, 2 Drawing Sheets

POWER TOOL WITH CIRCUIT FOR SENSING CONTACT BETWEEN AN IMPLEMENT AND AN OBJECT

CLAIM OF PRIORITY

This application claims priority to a pending Indian application with serial number 4066/CHE/2012, which is entitled "POWER TOOL WITH CIRCUIT FOR SENSING CONTACT BETWEEN AN IMPLEMENT AND AN OBJECT," and was filed on Sep. 28, 2012.

TECHNICAL FIELD

This disclosure relates generally to power tools, and, more specifically, to systems and methods for detecting contact between a human and a moving implement in a power tool.

BACKGROUND

Detection or sensing systems have been developed for use with various kinds of manufacturing equipment and power tools. Such detection systems are operable to trigger a reaction device by detecting or sensing the proximity or contact of some appendage of an operator with some part of the equipment. For example, existing capacitive contact sensing systems in table saws detect contact between the operator and the blade.

FIG. 1 depicts a prior art capacitive sensing based detection system 90 that is incorporated with a table saw 1. The detection system 90 generates an excitation voltage that is electrically coupled to a movable blade 22 of the saw 1 and detects the current drawn by the blade 22. The amplitude or phase of the detected current and/or excitation voltage changes when the blade 22 comes into contact with an electrically conductive object (such as an operator's hand, finger or other body part, as well as work pieces). The characteristics of the changes are used to trigger the operation of a reaction system 92. The reaction system 92 disables operation of the blade 22 by, for example, applying a brake to cease motion of the blade 22 and/or by dropping or otherwise removing the blade 22 from the cutting area. One example reaction system 92 uses an explosive charge to drive a stopper (not shown) into the blade 22 to arrest the motion of the blade 22. In addition, or instead, an example reaction system 92 drops or collapses a blade support member (not show) to urge the blade 22 below the surface of the table 14.

The embodiment of the detection system 90 shown in FIG. 1 includes an oscillator 10 that generates a time-varying signal on line 12. The time-varying signal is any suitable signal type including, for example, a sine wave, a sum of multiple sine waves, a chirp waveform, a noise signal, etc. The frequency of the signal is chosen to enable distinction between contact with the first object, such as a finger or hand, and a second object, such as wood or other material to be cut by the power tool. In the embodiment of FIG. 1, the frequency is 1.22 MHz, but other frequencies can also be used, as well as non-sinusoidal wave shapes. The oscillator 10 is electrically connected to the earth ground for the AC power source that provides the energy to operate the saw table 14 to enable the detection system and the table saw to be commonly ground to earth ground. As shown in FIG. 1, the blade 22 is disposed vertically in an opening defined by the saw table 14 (or work surface or cutting surface or platform).

The oscillator 10 is connected to two voltage amplifiers or buffers 16, 18 through the line 12. The first voltage amplifier 16 has an output connected to line 20, which operatively couples the output of the oscillator to the saw blade 22. A current sensor 24 operatively couples a signal from line 20 onto line 26 that is fed to an amplifier 28, the output of which is connected to a processor 30 by line 32. The current sensor 24 is, for example, a current sense transformer, a current sense resistor, a Hall Effect current sense device, or other suitable type of current sensor. An output line 34 from the processor 30 is operatively connected to the reaction system 92 so that the processor 30 triggers the reaction system 92 if predetermined conditions are detected indicating, for example, contact between the blade 22 and the first object.

The signal on line 26 is indicative of the instantaneous current drawn by the blade 22. Because the saw blade 22 is in motion during operation of the table saw, the connection is made through an excitation plate 36, which is mounted generally parallel to the blade 22. The plate 36 is driven by the first voltage amplifier 16, and is configured with a capacitance of approximately 100 picoFarad (pF) relative to the blade 22 in the embodiment of FIG. 1. The plate 36 is held in a stable position relative to the side of the blade 22. The excitation plate 36 is configured to follow the blade 22 as the height and bevel angle of the blade 22 are adjusted during operation of the saw 1.

The capacitance between the first object and the saw table 14 (or power line ground if one is present) is in the range of approximately 30-50 pF in the embodiment of FIG. 1. When the capacitance between the excitation plate 36 and the saw blade 22 exceeds the capacitance between the first object and the saw table 14, the detection thresholds are not unduly affected by changes in the plate-to-blade capacitance. In the configuration of FIG. 1, the plate 36 is arranged in parallel with the blade 22 on the side where the blade 22 rests against the arbor 37, so that changes in blade thickness do not affect the clearance between the blade 22 and the plate 36. Other methods of excitation, including contact through the arbor bearings or brush contact with the shaft or the blade, could be used to the same effect.

In the detection system 90, the second-amplifier 18 is connected to a shield 38, and the amplifier 18 drives the shield 38 to the same potential as the excitation plate 36. Also, sensors in the detection system 90 optionally monitor the level of electrical current drawn by the shield 38. The shield 38 extends around the blade 22 underneath the table 14, and is spaced some distance away from the blade 22 on the top of the table 14 in the configuration of FIG. 1. The configuration of the shield 38 reduces the static capacitance between the blade 22 and the table 14, which acts as a ground plane if the table is not electrically connected to an earth ground. In various embodiments, the shield 38 is a continuous pocket of mesh, or some other type of guard, which is electrically equivalent to a Faraday cage at the excitation frequencies generated by the oscillator 10. The shield 38 optionally includes a component that moves with the blade adjustments, or is large enough to accommodate the blade's adjustment as well as the various blades that fit the table saw. In the configuration of FIG. 1, the shield 38 moves with the blade adjustments, and includes a throat plate area of the table top 14.

The processor 30 performs various pre-processing steps and implements an adaptive trigger to detect conditions indicative of contact between the first object and the blade 22. The processor 30 optionally includes one or more associated analog-to-digital (A/D) converters. The blade current signal from the current sensor 24 is directed to one or more of the A/D converters, which generate a corresponding digital signal. A blade voltage signal representing the voltage drop between the blade 22 and the excitation plate 36 is directed to an A/D converter to generate a digital blade voltage signal in some embodiments. The processor 30 receives the digitized signal and performs various digital signal processing operations and/or computes derivative parameters based on the received signal. The processor 30 analyzes or otherwise performs operations on the conditioned blade signal to detect conditions indicative of contact between the first object and the blade 22.

As noted above, existing detection systems, such as the system 90 of FIG. 1, require a connection to earth ground to detect contact between a human and the implement of the power tool, such as the blade 22. As long as the operator is electrically connected to earth ground, these systems detect the approach of the operator to the moving implement. These systems, however, are less reliable when the operator is not well connected to earth ground. In light of these issues, improvements to detection systems that improve detection of contact between an implement and a portion of the human body would be beneficial.

SUMMARY

In one embodiment, a power tool that moves an implement and senses contact between an object and the moving implement has been developed. The power tool includes a terminal configured to receive an alternating current (AC) from an AC current source, which is electrically connected to earth ground, an implement configured for movement, an actuator operatively connected to the implement and electrically connected to the terminal to enable the actuator to operate and move the implement, and a printed circuit card to which a sensing circuit and a switching power supply are mounted, the switching power supply being electrically connected to the terminal to receive the AC current and being configured to generate electrical power for distribution to components on the printed circuit card, and the sensing circuit being electrically connected to the switching power supply to receive the electrical power and being configured to generate a sensing current that is electrically coupled to the implement, the printed circuit card being electrically connected to signal ground, but not electrically connected to earth ground to enable the sensing circuit to detect discharge of the sensing current to an object by the implement.

DETAILED DESCRIPTION

For the purposes of promoting an understanding of the principles of the embodiments described herein, reference is now made to the drawings and descriptions in the following written specification. No limitation to the scope of the subject matter is intended by these references. This patent also encompasses any alterations and modifications to the illustrated embodiments as well as further applications of the principles of the described embodiments as would normally occur to one skilled in the art to which this document pertains.

As used herein, the term "power tool" refers to any tool with one or more moving parts that are moved by an actuator, such as an electric motor, an internal combustion engine, a hydraulic or pneumatic cylinder, and the like. For example, power tools include, but are not limited to, bevel saws, miter saws, table saws, circular saws, reciprocating saws, jig saws, band saws, cold saws, cutters, impact drives, angler grinders, drills, jointers, nail drivers, sanders, trimmers, and routers. As used herein, the term "implement" refers to a moving part of the power tool that is at least partially exposed during operation of the power tool. Examples of implements in power tools include, but are not limited to, rotating and reciprocating saw blades, drill bits, routing bits, grinding disks, grinding wheels, and the like. As described below, a sensing circuit integrated with a power tool is used to halt the movement of the implement to avoid contact between a human operator and the implement while the implement is moving.

Figure 1:
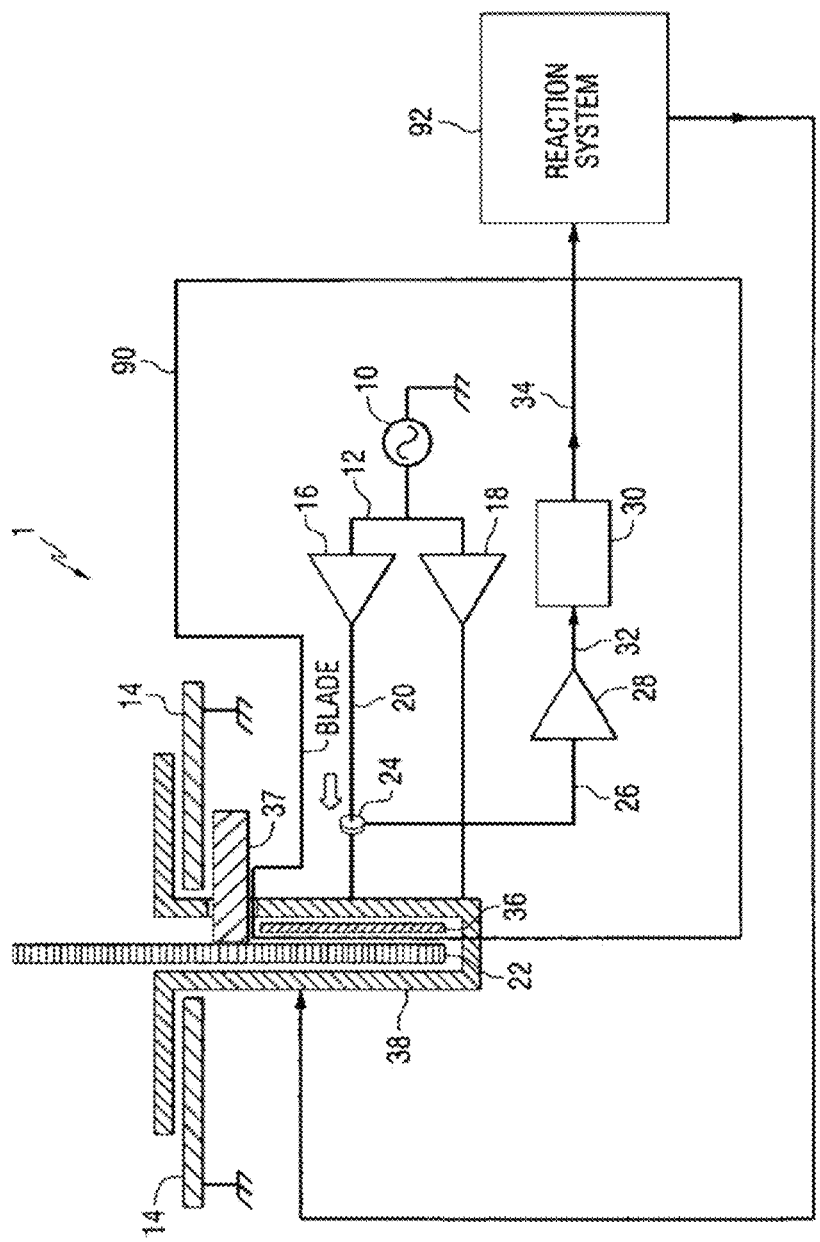
FIG. 1 is a schematic diagram of a prior art table saw including a prior art detection system for detecting contact between a human and a saw blade.
Figure 2:
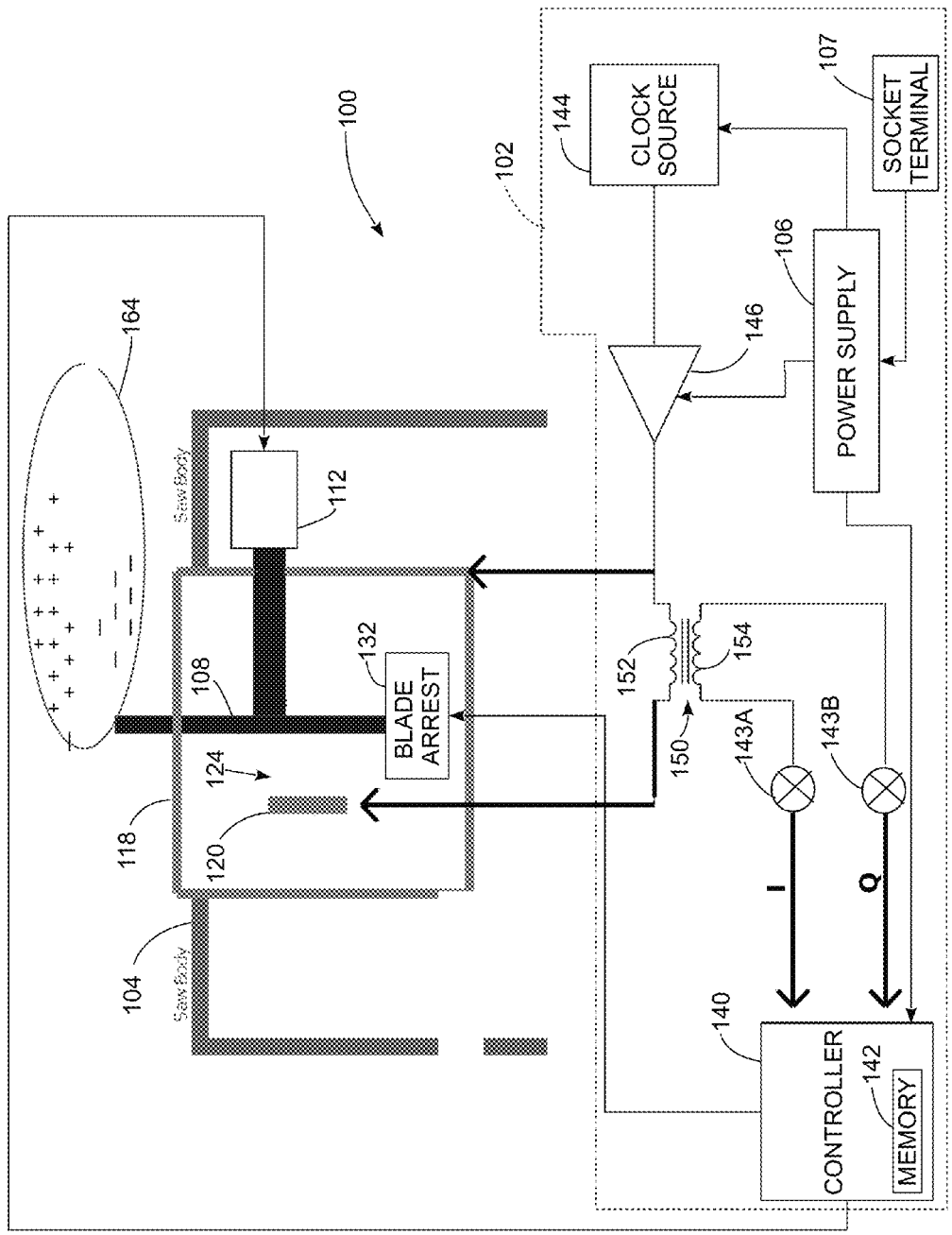
FIG. 2 is a schematic diagram of a table saw including a sensing circuit for identifying contact between a human and a saw blade when electronic components in the detection system are isolated from an earth ground.

FIG. 2 depicts a table saw 100. The table saw 100 includes a table 104 through which a saw blade 108 extends for cutting work pieces, such as pieces of wood. The table saw 100 also includes an electric motor 112, a blade enclosure 118, and a blade arrest device 132. A plate 120 and the blade 108 form a capacitor 124 where a small air gap between the plate 120 and the blade 108 acts as a dielectric. In different embodiments, the plate 120 is or includes a capacitive, resistive, projective capacitive, optical, thermal, near infrared or other suitable sensing mechanism that either senses contact between the blade and an object or detects an object that approaches the blade 108. The blade enclosure 118 is electrically connected to the saw blade 108. The general configuration of the table 104, blade 108, and motor 112 are well known to the art for use in cutting work pieces and are not described in greater detail herein. Some components that are commonly used in table saws, such as guides for work pieces, blade height adjustment mechanisms, and blade guards are omitted from FIG. 2 for clarity.

The saw 100 includes a printed circuit card 102 to which a sensing circuit, which includes a clock source 144, driver amplifier 146, transformer 150 and a controller 140, are mounted. An electrical terminal socket 107, which is mounted on the printed circuit card 102 in FIG. 2 or otherwise electrically connected to the switched power supply 106 in another embodiment, receives an alternating current (AC) electrical power signal from an external power source, such as a generator or electrical utility provider. The switched power supply 106 converts the AC power signal from the external power source to a direct current (DC) electrical power signal at one or more voltage levels to supply power to the controller 140, clock source 144, and amplifier 146. The printed circuit card 102 and the components mounted on the printed circuit card 102 are electrically isolated from an earth ground. The power supply 106 serves as a local ground for the components mounted to the printed circuit card 102.

In the saw 100, the clock source 144 and driving amplifier 146 in the sensing circuit generate a time varying electrical current that is directed through a primary winding 152 in the transformer 150, the plate 120, the blade 108, and the blade enclosure 118. The time varying electrical current is referred to as a "sensing current" because the controller 140 senses contact between the blade 108 and a portion of a human body with reference to changes in the magnitude of the sensing current. The time varying sensing current is a complex valued signal that includes both an in-phase component and quadrature component. The sensing current passes through the primary winding 152 in the transformer 150 to the plate 120. The changes in the primary winding caused by discharges between the plate 120 and the blade 108 produce an excitation signal in the secondary winding 154 of the transformer 150.

The excitation signal is another complex valued signal that corresponds to the sensing current passing through the primary winding 152.

The controller 140 in the sensing circuit is operatively connected to the motor 112, the secondary winding 154 in the transformer 150, a mechanical blade arresting device 132. The controller 140 includes one or more digital logic devices including general purpose central processing units (CPUs), microcontrollers, digital signal processors (DSPs), analog to digital converters (ADCs), field programmable gate arrays (FPGAs), application specific integrated circuits (ASICs) and any other digital logic devices that are suitable for operation of the saw 100. The controller 140 includes a memory 142 that stores programmed instructions for the operation of the controller 140.

During operation of the sensing circuit, the clock source 144 generates a time varying signal, such as sinusoidal waveform at a predetermined frequency. In the embodiment of FIG. 2, the clock source 144 is configured to generate a signal at a frequency of 1.22 MHz, which is known to propagate through the human body. The amplifier 146 generates the sensing current as an amplified version of the signal from the clock source 144 with sufficient amplitude to drive the transformer 150 and capacitor 124 for detection by the controller 140.

During operation of the sensing circuit, the controller 140 receives the in-phase component I of the excitation signal in the secondary winding 154 through a first demodulator 143A and the quadrature component Q of the excitation signal through a second demodulator 143B. The transformer 150 isolates the sensing current flowing through the primary winding 152, plate 120, saw blade 108, and blade enclosure 118 from demodulators 143A and 143B that supply the in-phase and quadrature phase components of the signal, respectively, to the controller 140. Since the demodulators 143A and 143B generate electrical noise, the transformer 150 reduces or eliminates the effects of the noise on the primary winding 152 and sensing current. In one configuration, the transformer 150 is a 1:1 transformer where the primary winding 152 and secondary winding 154 have an equal number of turns. In alternative configurations, the ratio of windings in the primary winding 152 and secondary winding 154 are selected to either step-up or step-down the signal for demodulation and monitoring by the controller 140. The controller 140 includes one or more ADCs, filters, and other signal processing devices required to generate digital representations of the magnitude of the in-phase signal I and quadrature signal Q. The controller 140 identifies a magnitude of the sensing current A at a given time as a Pythagorean sum of the in-phase and quadrature components, as illustrated in the following equation: $A=\sqrt{I^2+Q^2}$. The controller 140 measures the demodulated signal at a predetermined frequency, such as a 100 KHz sampling rate, to identify changes in the magnitude A of the complex valued signal.

As the motor 112 rotates the blade 108, the rotating blade 108 comes into contact with different objects, including blocks of wood and other work pieces. A small portion of the charge that is accumulated on the blade 108 flows into the work piece. The electrical conductivity of the wood work piece is, however, quite low, and the controller 140 in the sensing circuit continues to enable the motor 112 to rotate the saw blade 108. For example, when the blade 108 engages a block of wood, the controller 140 typically measures a small change in the sensing current A, but the change in the sensing current is identified as corresponding to wood or another material with low electrical conductivity.

While work pieces, such as wood, have low electrical conductivity, another object, such as part of the human body, has a much higher electrical conductivity and absorbs a much greater portion of the charge on the blade 108 as the part approaches the blade 108. In FIG. 2 a portion of a human body 164, such as a hand, finger, or arm, is represented by a charge cloud indicating the flow of charge from the blade 108 to the human body. The controller 140 identifies imminent contact between the human body 164 and the blade 108 as a rapid change in the magnitude A of the sensing current at the time when the human body 164 nears the blade 108. In response to the rapid change in the magnitude of the sensing signal, the controller 140 deactivates the motor 112 and engages the blade arrest device 132 to halt the motion of the blade 108, and optionally retract the blade 108 before the blade contacts the human body 164.

In the configuration of FIG. 2, the saw blade 108 is a circular saw blade with a plurality of teeth arranged around the circumference of the blade. The teeth engage work pieces to cut the work pieces during normal operation of the saw. The teeth in the blade 108 also accumulate electrical charge from the sensing current. The teeth on the saw blade facilitate discharge of the electrical charge accumulated on the saw blade 108 to the human body 164 as the human body approaches the saw blade 108. In some configurations, an electrical arc between the human body 164 and the tips of the teeth in the saw blade 108 enables the charge accumulated on the blade 108 to flow into the human 164 prior to the human 164 actually contacting the blade 108. The arc distance is typically on the order of a few millimeters. The controller 140 identifies the change in the magnitude A of the sensing current and halts the blade 108 in response to discharge from the blade 108 due either to direct contact or close proximity between the human 164 and the blade 108.

In the configuration of FIG. 2, the human body has sufficient conductivity and capacity to draw charge from the blade 108 even when the printed circuit card 102 is isolated from earth ground and when the human body 164 is isolated from earth ground, such as when a human operator wears shoes with rubber soles. Thus, while the printed circuit card 102 and the human 164 do not share a common electrical ground, the controller 140 continues to identify contact between the human 164 and the blade 108 through identification of a rapid change in the identified sensing current amplitude A. While the absolute value of the amplitude A may vary during operation of the saw 100, the controller 140 can still identify contact with the human 164 in response to the magnitude and time of the change in the relative value of the amplitude A. During operation of the saw 100, the controller 140 is configured to identify contact with the human 164 and to deactivate the motor 112 and engage the blade arrest mechanism 132 to halt the saw blade 108 in a time period of approximately 1 millisecond.

In the saw 100, the controller 140 deactivates the electrical motor 112 in response to identification of contact between the blade 108 and a portion of a human. In the saw 100, the saw blade 108 generally continues rotating for a period of several seconds due to the momentum that the saw blade 108 accumulates during operation. The blade arrest device 132 is configured to either halt the saw blade 108 in a much shorter period of time, to drop the saw blade 108 below the table 104 to retract the saw blade 108 from contact with the human, or to both halt and retract the blade 108. In the saw 100, the blade arrest 132 includes a brake mechanism that halts the rotation of the blade 108. Additionally, the blade arrest 132 withdraws the blade 108 below the surface of the table 104. In other power tool embodiments, the moving implement halts in a short period of time after deactivation of an actuator without the requirement for an additional brake mechanism.

While FIG. 2 depicts a table saw as an illustrative example of a power tool, alternative embodiments incorporate the sensing circuit embodied in FIG. 2 into a wide range of power tools including, but not limited to, handheld electric drills, drill presses, handheld circular saws, reciprocating saws, band saws, routers, grinders, and any other power tool with a moving implement.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A power tool that moves an implement comprising:
   a terminal configured to receive an alternating current (AC) from an AC current source, which is electrically connected to earth ground;
   an implement configured for movement;
   an actuator operatively connected to the implement and electrically connected to the terminal to enable the actuator to operate and move the implement; and
   a printed circuit card to which a sensing circuit and a switching power supply are mounted, the switching power supply being electrically connected to the terminal to receive the AC current and being configured to generate electrical power for distribution to components on the printed circuit card, and the sensing circuit being electrically connected to the switching power supply to receive the electrical power and being configured to generate a sensing current that is electrically coupled to the implement, the printed circuit card being electrically connected to signal ground, but not electrically connected to earth ground to enable the sensing circuit to detect discharge of the sensing current to an object by the implement.

2. The power tool of claim 1, further comprising:
   a plate that is electrically connected to the sensing circuit and positioned proximate to the implement without touching the implement to enable the sensing current to be capacitively coupled to the implement.

3. The power tool of claim 2, the sensing circuit further comprising:
   a transformer having a primary winding and a secondary winding, the primary winding being electrically connected between the plate and a sensing current generator, and the secondary winding being electrically coupled to a sampling circuit to enable a current induced in the secondary winding by changing current in the primary winding to be sampled and processed to detect discharge of the sensing current to the object by the implement.

4. The power tool of claim 3, the implement further comprising:
   a circular saw blade with teeth that facilitate the discharge of the sensing current from the circular saw blade to the object.

5. The power tool of claim 1 further comprising:
   a controller mounted on the printed circuit card and configured to identify a magnitude of the sensing current, the controller being configured to deactivate the actuator in response to a change in the identified magnitude of the sensing current corresponding to a discharge of electrical charge accumulated on the implement to a human in proximity to the implement.

* * * * *